United States Patent
Lee

(10) Patent No.: US 6,201,294 B1
(45) Date of Patent: *Mar. 13, 2001

(54) BALL GRID ARRAY SEMICONDUCTOR PACKAGE COMPRISED OF TWO LEAD FRAMES

(75) Inventor: Ju-Hwa Lee, Cheongju-si (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/985,959

(22) Filed: Dec. 5, 1997

(30) Foreign Application Priority Data

Dec. 28, 1996 (KR) ................................ 96/75051

(51) Int. Cl.⁷ .................................... H01L 23/48
(52) U.S. Cl. ................. 257/669; 257/676; 257/738; 257/778
(58) Field of Search .................... 257/672, 668, 257/669, 670, 697, 700, 738, 778, 692, 693, 684, 787, 676, 666; 438/108, 111, 112; 361/923, 772, 773, 813; 29/841, 855, 856

(56) References Cited

U.S. PATENT DOCUMENTS

| | | | |
|---|---|---|---|
| 5,157,480 | * 10/1992 | McShane | 257/676 |
| 5,541,450 | * 7/1996 | Jones et al. | 257/697 |
| 5,578,871 | * 11/1996 | Fierkens | 257/676 |
| 5,594,234 | * 1/1997 | Carter, Jr. et al. | 257/676 |
| 5,619,065 | * 4/1997 | Kim | 257/673 |
| 5,736,780 | * 4/1998 | Murayama | 257/700 |
| 5,770,888 | * 6/1998 | Song et al. | 257/696 |
| 5,825,628 | * 10/1998 | Garbelli et al. | 257/738 |
| 5,894,107 | * 4/1999 | Lee et al. | 257/738 |
| 5,898,212 | * 4/1999 | Kim | 257/672 |
| 5,926,696 | * 7/1999 | Baxter et al. | 257/700 |

FOREIGN PATENT DOCUMENTS 40 6013485 * 1/1994 (JP) .
40 6163607 * 6/1994 (JP) .

* cited by examiner

Primary Examiner—Olik Chaudhuri
Assistant Examiner—Alonzo Chambliss
(74) Attorney, Agent, or Firm—Morgan, Lewis & Bockius LLP

(57) ABSTRACT

A ball grid array (BGA) semiconductor package includes a paddle, a semiconductor chip on the paddle, a plurality of first leads around a periphery of the paddle, a plurality of second leads attached to a lower surface of each of the first leads, a plurality of conductive wires electrically connecting the semiconductor chip and the first leads, a molding unit sealing the paddle, the semiconductor chip, the first leads, the second leads, and the conductive wires, except for a lower portion of the second leads, and a plurality of solder balls attached to the lower portion of the second leads. A method of fabricating a ball grid array (BGA) semiconductor package having first and second frames includes the steps of attaching a semiconductor chip to a paddle located on the first frame, electrically connecting a plurality of first leads to the semiconductor chip, electrically connecting a plurality of second leads to the plurality of first leads, aligning a first junction unit of the first frame with a second junction unit of the second frame, attaching the first frame to the second frame, molding the first and second frames, and attaching a plurality of solder balls to each of the plurality of second leads.

17 Claims, 4 Drawing Sheets

BALL GRID ARRAY SEMICONDUCTOR PACKAGE COMPRISED OF TWO LEAD FRAMES

This application claims the benefit of Korean Application Number 75051/1996 filed on Dec. 28, 1996, which is hereby incorporated by reference.

BACKGROUND OF THE INVENTION

1. Field of the Invention

The present invention relates to semiconductor package, and more particularly, to a ball grid array (hereinafter, "BGA") semiconductor package and method of fabricating the same.

2. Description of the Related Art

A quad flat package (hereinafter, "QFP") has received great attention as part of a multipin trend in the semiconductor packaging technology. The width of outer leads becomes narrower and the pitch between the leads become minute in the QFP. The leads are, however, easily bent and the package is hard to align on a printed circuit board (PCB) when the leads are surface-mounted on the PCB. Moreover, it is difficult to control the amount of solder in the manufacturing process.

Accordingly, a BGA semiconductor package has been developed to solve the problems of the QFP. The BGA semiconductor package has solder balls instead of the outer leads, so that the disadvantages of the QFP can be overcome.

FIG. 1 is a longitudinal cross-sectional view showing a conventional BGA semiconductor package. The conventional BGA semiconductor package includes a substrate 1 having a plurality of inner leads (not illustrated) in a form of miniature wirings, a semiconductor chip 2 attached on the upper surface of the substrate 1 using an adhesive 3, a plurality of conductive wires 4 electrically connecting the semiconductor chip 2 and each one end of the inner leads disposed in the substrate, a molding unit 5 sealing a predetermined region of the upper surface of the substrate 1 with an epoxy molding compound to encapsulate the semiconductor chip 2 and the wires 4, and a plurality of solder balls 6 formed on the lower surface of the substrate 1 and connected with the other end of each inner lead in the substrate 1.

However, the conventional BGA semiconductor package employs the substrate 1 having the inner leads disposed therein, and the substrate 1 will already have absorbed moisture during the fabricating process of conductive layers and an insulating layers through an etching process. Accordingly, delamination and cracking caused by vapor pressure inside the substrate reduce the reliability of the semiconductor package. Further, since the epoxy molding unit 5 is formed only on the upper surface of the substrate 1, delamination occurs easily at the boundary surface of the substrate 1 and the molding unit 5.

SUMMARY OF THE INVENTION

Accordingly, the present invention is directed to a ball grid array (BGA) semiconductor package that substantially obviates one or more of the problems due to limitations and disadvantages of the related art.

An object of the present invention to provide an improved BGA semiconductor package and method of fabricating the same by using a lead frame instead of a substrate to avoid delamination and exfoliation of the package caused by the substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the BGA semiconductor package includes a paddle, a semiconductor chip attached on the upper surface of the paddle using an insulating adhesive, a plurality of first leads arranged to have a constant interval therebetween around the peripheral portion of the paddle and one end of each of which is bent downward, a plurality of second leads attached on the lower surfaces of the first leads, a plurality of conductive wires electrically connecting the semiconductor chip and the first leads, a molding unit sealing the entire structure in such a manner that a portion of the lower surface of each of the second leads is externally exposed, and a plurality of solder balls respectively attached on the exposed lower surfaces of the second leads.

In another aspect, the ball grid array semiconductor package includes a paddle, a semiconductor chip on the paddle, a plurality of first leads around a periphery of the paddle, a plurality of second leads attached to a lower surface of each of the first leads, a plurality of conductive wires electrically connecting the semiconductor chip and the first leads, a molding unit sealing the paddle, the semiconductor chip, the first leads, the second leads, and the conductive wires, except for a lower portion of the second leads, and a plurality of solder balls attached to the lower portion of the second leads.

In another aspect, the ball grid array semiconductor package includes a semiconductor chip, a paddle on the semiconductor chip, a plurality of first leads around a periphery of the paddle, a plurality of second leads attached to a lower surface of each of the first leads, a plurality of conductive wires electrically connecting the semiconductor chip and the first leads, a molding unit sealing the paddle, the semiconductor chip, the first leads, the second leads, and the conductive wires, except for a lower portion of the second leads, and a plurality of solder balls attached to a lower portion of the second leads.

In a further aspect, the method of fabricating a ball grid array (BGA) semiconductor package having first and second frames, includes the steps of attaching a semiconductor chip to a paddle located on the first frame, electrically connecting a plurality of first leads to the semiconductor chip, electrically connecting a plurality of second leads to the plurality of first leads, aligning a first junction unit of the first frame with a second junction unit of the second frame, attaching the first frame to the second frame, molding the first and second frames, and attaching a plurality of solder balls to each of a plurality of second leads.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
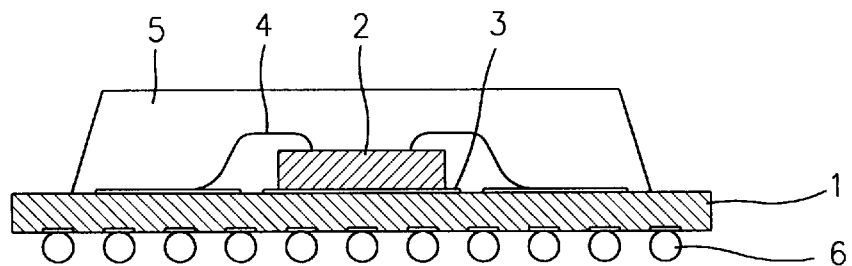
FIG. 1 is a cross-sectional view of a conventional BGA semiconductor package.
Figure 2A:
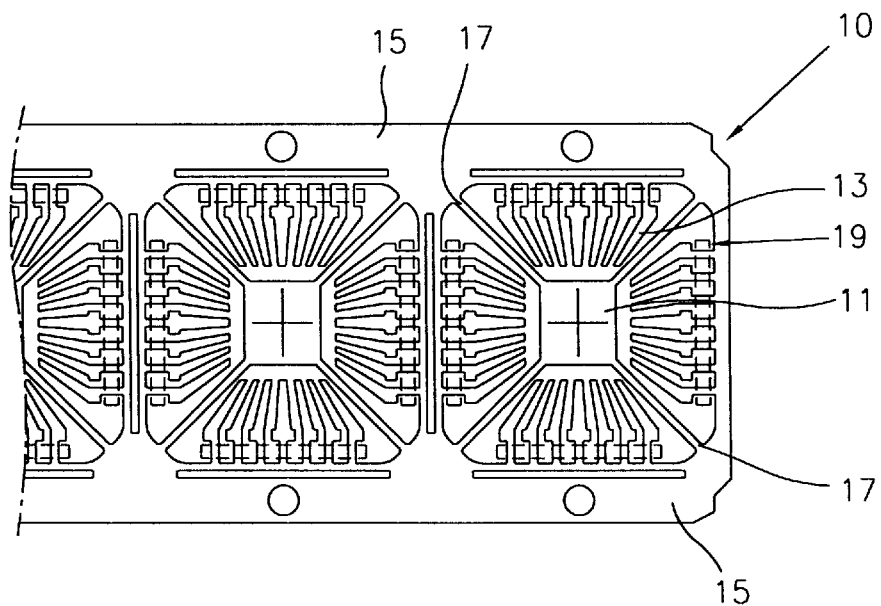
FIGS. 2A and 2B are a plan view and a cross-sectional view of a first lead frame according to the present invention, respectively.
Figure 2B:
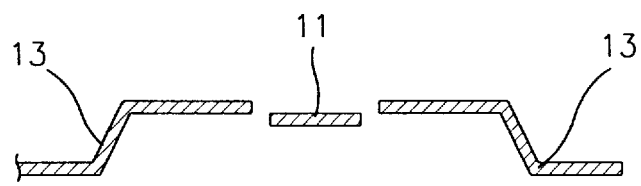

As shown in FIG. 2A, a first lead frame 10 includes a rectangular paddle 11 for receiving a semiconductor chip (not illustrated). A plurality of first leads 13 having one end of each bent toward the peripheral portion of the paddle 11 to have a predetermined shape as shown in FIG. 2B. The other end of each first lead 13 is connected to and supported by a lead support bar 15. The paddle 11 is also connected to the lead support bar 15 by a plurality of tie bars 17. A junction unit 19 of the first lead frame 10 may be connected to a junction unit 25 of a second lead frame 20 as shown in FIG. 3.

Figure 3:
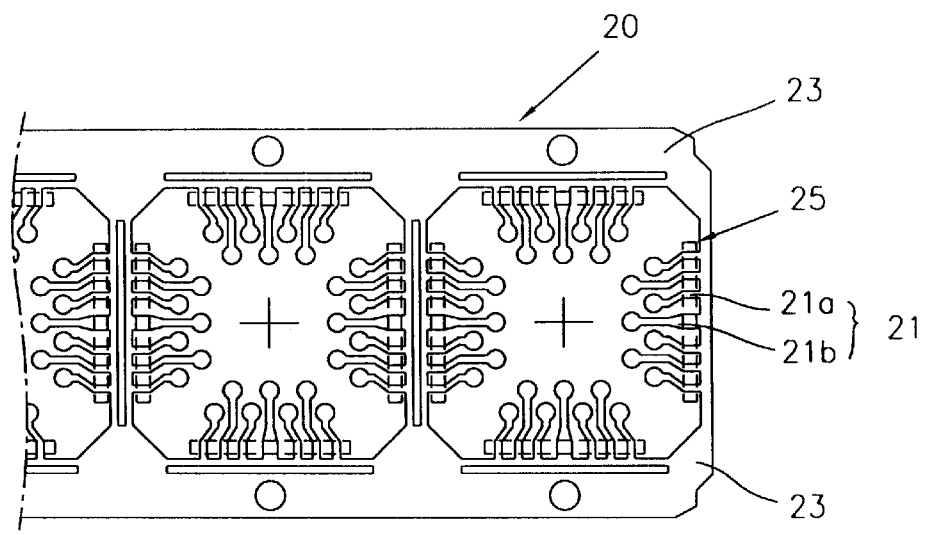
FIG. 3 is a plan view of a second lead frame according to the present invention.

FIG. 3 is a plan view of a second lead frame according to the present invention. A plurality of second leads 21 are formed corresponding to each first lead 13 in FIG. 2. One end of each second lead 21 has a circular shape and the other end is connected to a lead support bar 23. The regularly arranged second leads 21 having two different lengths 21a and 21b are formed alternately, so that the ends having the circular shape of the second leads 21 are not overlapped with each other. Reference numeral 25 denotes a junction unit.

Figure 4:
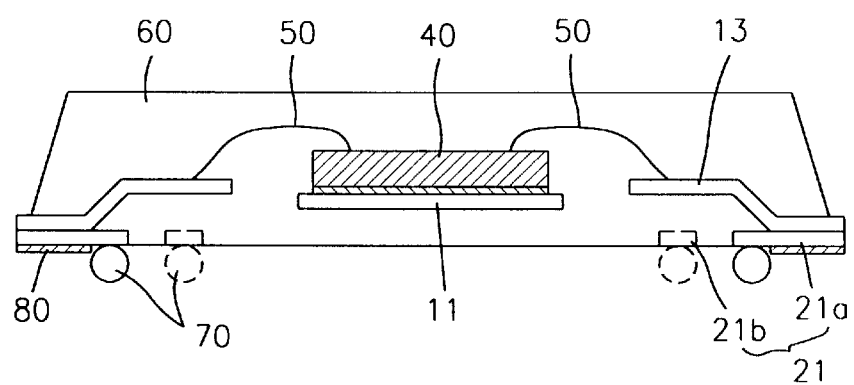
FIG. 4 is a cross-sectional view of a BGA semiconductor package according to a first embodiment of the present invention.

FIG. 4 is a cross-sectional view of a BGA semiconductor package according to a first embodiment of the present invention. As shown in FIG. 4, the BGA semiconductor package in the first embodiment includes a paddle 11, and a plurality of first leads 13 having one end of each bent to have a predetermined shape. A plurality of second leads 21 are attached to the lower surfaces of the first leads 13. A semiconductor chip 40 is attached on the upper surface of the paddle 11 using an insulating adhesive 30. The semiconductor chip 40 and the first leads 13 are electrically connected by a plurality of conductive wires 50. A molding unit 60 is formed to seal the entire structure and expose the lower surface of each of the second leads 21. A solder ball 70 is attached to the exposed lower surface of each of the second leads 21. Specifically, the solder balls 70 are attached to the end portions (having the circular shape) of the second leads 21 in FIG. 3. The lower surfaces of the second leads are coated by a protective coating 80 so as to prevent corrosion except for a portion where the solder balls 70 are attached.

Figure 5:
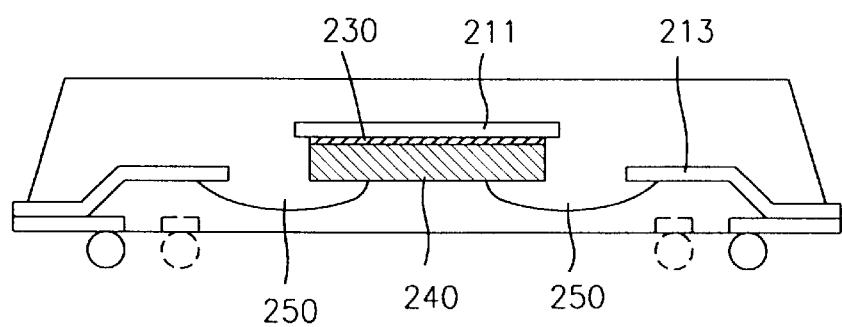
FIG. 5 is a cross-sectional view of the BGA semiconductor package according to a second embodiment of the present invention.

FIG. 5 is a cross-sectional view of the BGA semiconductor package according to a second embodiment of the present invention. As shown in FIG. 5, a semiconductor chip 240 is attached to the lower surface of a paddle 211 by an insulating adhesive 230 and a semiconductor chip 240 and first leads 213 are electrically connected by a plurality of conductive wires 250 below the paddle 211. The rest of the structure is identical to that of the first embodiment of the present invention as shown in FIG. 4. The semiconductor chip 40 is attached to the upper surface of the paddle 11 in the first embodiment, whereas the semiconductor chip 240 is attached to the lower surface of the paddle 211 in the second embodiment. The height of the completed semiconductor package is reduced in the second embodiment.

Figure 6:
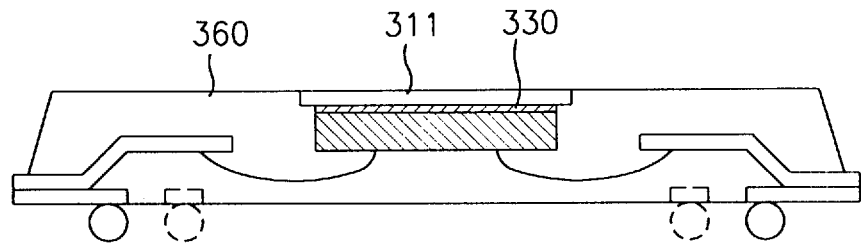
FIG. 6 is a cross-sectional view of the BGA semiconductor package according to a third embodiment of the present invention.

FIG. 6 is a cross-sectional view of the BGA semiconductor package according to a third embodiment of the present invention. As shown in FIG. 6, a molding unit 360 is formed to seal the entire structure except for the upper surface of a paddle 311. Using this structure, heat generated from a semiconductor chip 340 is more easily dissipated to the outside of the package.

Figure 7:
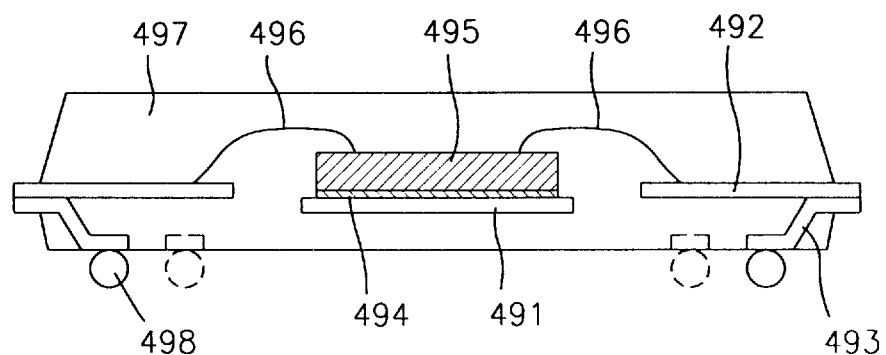
FIG. 7 is a cross-sectional view of the BGA semiconductor package according to a fourth embodiment of the present invention.

FIG. 7 is a cross-sectional view of the BGA semiconductor package according to a fourth embodiment of the present invention. In the fourth embodiment, a plurality of flat first leads 492 are arranged to have a predetermined interval around the peripheral portion of a paddle 491, and a plurality of second leads 493 have one end of each bent toward a portion of the lower surface of the first leads 492. A semiconductor chip 495 is attached to the upper surface of a paddle 491 by an insulating adhesive 494. The semiconductor chip 495 and the first leads 492 are electrically connected by a plurality of conductive wires 496. A molding unit 497 is formed to seal the entire structure except for a portion of the lower surface of the second leads 493, and a solder ball 498 is attached to the exposed portion of the lower surface of the second leads 493.

Figure 8:
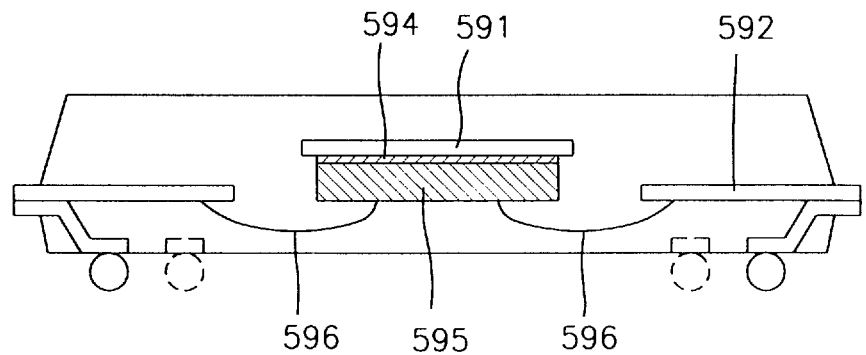
FIG. 8 is a cross-sectional view of the BGA semiconductor package according to a fifth embodiment of the present invention.

FIG. 8 is a cross-sectional view of the BGA semiconductor package according to a fifth embodiment of the present invention. Referring to FIG. 8, a semiconductor chip 595 is attached to the lower surface of a paddle 591 by an insulating adhesive 594. The semiconductor chip 595 and first leads 592 are electrically connected by conductive wires 596 below the paddle 591. The rest of the structure is identical to that of the fourth embodiment of the present invention shown in FIG. 7. The semiconductor chip 495 is attached to the upper surface of the paddle 491 in the fourth embodiment, whereas the semiconductor chip 595 is attached to the lower surface of the paddle 591 in the fifth embodiment. The height of the completed semiconductor package is reduced in the fourth embodiment.

Figure 9:
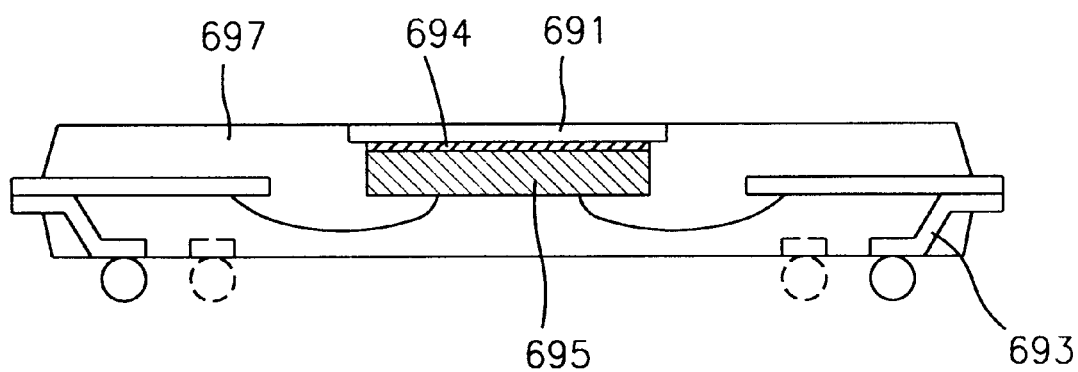
FIG. 9 is a cross-sectional view of the BGA semiconductor package according to a sixth embodiment of the present invention.

FIG. 9 is a cross-sectional view of the BGA semiconductor package according to a sixth embodiment of the present invention. A molding unit 697 is formed to seal the entire structure except for the upper surface of the paddle 691. In comparison with the fifth embodiment, heat generated from a semiconductor chip 595 is more easily dissipated to the outside of the package.

A method of fabricating the BGA semiconductor package according to the present invention will now be described in detail with reference to FIGS. 2 through 4.

First, the semiconductor chip (shown in FIG. 4) is attached to the upper or lower surface of the paddle 11 of the first frame 10 in FIG. 2 using the insulating adhesive 30. The semiconductor chip 40 and the first leads 13 are electrically connected by the conductive metal wires 50. Then, the junction unit 25 formed on the upper surface of the second lead frame 20 as shown in FIG. 3 is positioned to contact the junction unit 19 (shown in FIG. 2A) on the lower surface of the first lead frame 10. The first and second lead frames 10,20 are then attached by thermal compression. Here, the junction unit 19 of the first lead frame 10 having the first leads 13 formed therein is plated with tin (Sn), and the junction unit 25 of the second lead frame 20 is plated with gold (Au) Next, to protect the entire structure, the molding unit 60 is formed on the entire structure including the semiconductor chip 40, the wires 50, the first leads 13, and the second leads 21 by an epoxy molding compound. In this process, it is important that the lower surface of the second leads 21 are exposed to the outside of the molding unit 60. Then, a solder ball 70 is attached to the circular end portion of the exposed lower surface of each of the second leads 21 to prevent corrosion. Plating (or coating) is then carried out on the lower surfaces of the second leads 21 except for portions where the solder balls are attached. Thereafter, each lead support bar 15 and 23 of the first and second lead frames 10 and 20, which is exposed outside of the molding unit 60, is removed by trimming, so that the BGA semiconductor package of the present invention is completed.

As aforementioned, the BGA semiconductor package according to the present invention prevents exfoliation by using a minimum area of a lead frame instead of a substrate where minute wires are connected.

It will be apparent to those skilled in the art that various modifications and variations can be made in the Ball Grid Array Semiconductor Package of the present invention without departing from the spirit or scope of the invention. Thus, it is intended that the present invention cover the modifications and variations of this invention provided they come within the scope of the appended claims and their equivalents.

What is claimed is:

1. A ball grid array (BGA) semiconductor package, comprising:
    a paddle;
    a semiconductor chip on the paddle;
    a plurality of first leads around a periphery of the paddle;
    a plurality of second leads attached to a lower surface of each of the first leads, wherein the first and second leads are formed from two different lead frames and the second leads comprise first and second parts and each of the first parts is substantially longer than each of the second parts;
    a plurality of conductive wires electrically connecting the semiconductor chip and the first leads;
    a molding unit sealing the paddle, the semiconductor chip, the first leads, the second leads, and the conductive wires, except for a lower portion of the second leads, wherein the molding unit and the lower portion of the second leads form a substantially flat surface; and
    a plurality of solder balls attached to the lower portions of each of the second leads, the solder balls directly physically contacting the second leads.

2. The package according to claim 1, wherein the first leads each include a bilevel structure having an upper portion, a lower portion, and a connecting portion.

3. The package according to claim 1, further comprising a protective coating on the lower portion of the second leads.

4. The package according to claim 1, wherein the second leads each include a bilevel structure having an upper portion, a lower portion, and a connecting portion.

5. The package according to claim 1, further comprising an insulating adhesive attaching the semiconductor chip to the paddle.

6. The package according to claim 1, wherein the second leads include shorter and longer leads disposed alternately.

7. The package according to claim 1, wherein one end of each second lead has a circular shape.

8. The package according to claim 7, wherein the one end of each second lead is attached to a solder ball.

9. A ball grid array (BGA) semiconductor package, comprising:
    a semiconductor chip;
    a paddle on the semiconductor chip;
    a plurality of first leads around a periphery of the paddle;
    a plurality of second leads attached to a lower surface of each of the first leads, wherein the first and second leads are formed from two different lead frames and the second leads comprise first and second parts and each of the first parts is substantially longer than each of the second parts;
    a plurality of conductive wires electrically connecting the semiconductor chip and the first leads;
    a molding unit sealing the paddle, the semiconductor chip, the first leads, the second leads, and the conductive wires, except for a lower portion of the second leads, wherein the molding unit and the lower portion of the second leads form a substantially flat surface; and
    a plurality of solder balls attached to the lower portion of the second leads, the solder balls directly contacting the second leads.

10. The package according to claim 9, wherein the first leads each include a bilevel structure having an upper portion, a lower portion, and a connecting portion.

11. The package according to claim 9, further comprising a protective coating on the lower portion of the second leads.

12. The package according to claim 9, wherein the second leads each include a bilevel structure having an upper portion, a lower portion, and a connecting portion.

13. The package according to claim 9, further comprising an insulating adhesive attaching the paddle to the semiconductor chip.

14. The package according to claim 9, wherein an upper portion of the paddle is exposed to an outside of the package.

15. The package according to claim 9, wherein the second leads include shorter and longer leads disposed alternately.

16. The package according to claim 9, wherein one end of each second lead has a circular shape.

17. The package according to claim 16, wherein the one end of each second lead is attached to a solder ball.

* * * * *